(12) United States Patent
Athas

(10) Patent No.: US 7,075,347 B2
(45) Date of Patent: Jul. 11, 2006

(54) MULTIPHASE RESONANT PULSE GENERATORS

(75) Inventor: William C. Athas, San Jose, CA (US)

(73) Assignee: University of Southern California, Los Angeles, CA (US)

( * ) Notice: Subject to any disclaimer, the term of this patent is extended or adjusted under 35 U.S.C. 154(b) by 0 days.

(21) Appl. No.: 10/344,168

(22) PCT Filed: Aug. 8, 2001

(86) PCT No.: PCT/US01/24801

§ 371 (c)(1),
(2), (4) Date: Feb. 7, 2003

(87) PCT Pub. No.: WO02/15400

PCT Pub. Date: Feb. 21, 2002

(65) Prior Publication Data

US 2004/0130362 A1    Jul. 8, 2004

Related U.S. Application Data

(60) Provisional application No. 60/224,253, filed on Aug. 10, 2000.

(51) Int. Cl.
*H03K 3/00* (2006.01)
(52) U.S. Cl. .................. 327/129; 327/291; 327/304
(58) Field of Classification Search .......... 327/129, 327/291, 304, 293, 295; 331/117 R, 117 FE, 331/117 D, 108 B, 107 D; 307/108
See application file for complete search history.

(56) References Cited

U.S. PATENT DOCUMENTS

| | | | |
|---|---|---|---|
| 3,919,656 A | 11/1975 | Sokal et al. ............... 330/51 |
| 3,931,528 A | 1/1976 | Farnsworth et al. ........ 307/108 |
| 5,107,136 A | 4/1992 | Stekelenburg ............... 327/112 |
| 5,126,580 A | 6/1992 | Hiraoka et al. ............. 250/560 |
| 5,396,195 A | 3/1995 | Gabara ................... 331/113 R |
| 5,506,520 A | 4/1996 | Frank et al. ................... 326/96 |
| 5,559,463 A | 9/1996 | Denker et al. ............... 327/300 |
| 5,559,478 A * | 9/1996 | Athas et al. ........... 331/117 FE |
| 5,694,304 A * | 12/1997 | Telefus et al. ........... 363/21.03 |
| 5,734,285 A | 3/1998 | Harvey ....................... 327/291 |
| 5,821,923 A | 10/1998 | Van Amesfoort et al. ... 345/212 |
| 6,140,848 A | 10/2000 | Harvey ....................... 327/112 |
| 6,201,420 B1 | 3/2001 | Harvey ....................... 327/109 |
| 6,465,990 B1 * | 10/2002 | Acatrinei et al. ........... 323/222 |

FOREIGN PATENT DOCUMENTS

WO    WO94/15394    7/1994

(Continued)

OTHER PUBLICATIONS

International Search Report for PCT/US01/24801, dated Nov. 20, 2001.

(Continued)

*Primary Examiner*—Tuan T. Lam
*Assistant Examiner*—Hiep Nguyen
(74) *Attorney, Agent, or Firm*—McDermott Will & Emery LLP

(57) ABSTRACT

A multiphase resonant pulse generator (74) has N groups of N-1 switches (44,46,48) which, when activated, form N paths from a power supply (Vdc) to ground or a reference voltage. Here N is a positive integer greater than 2. Each of the paths includes an inductance (38,40,42) and N-1 switches. The signal outputs (X1, X2, X3) from each of the N paths are cross cooled to switches belonging to the other N-1 paths to activate or deactivate the groups of switches.

17 Claims, 6 Drawing Sheets

FOREIGN PATENT DOCUMENTS

WO     WO97/09783     3/1997
WO     WO02/15400 A1     2/2002

OTHER PUBLICATIONS

International Preliminary Examination Report, dated Nov. 12, 2002.
Athas, W.C. Practical Considerations of Clock-Powered Logic. Paper given at the International Symposium on Low Power Electronics and Design, Feb. 2000, 6 pages.
Athas, W.C. Pulsed-Power Techniques for Energy-Efficient Portable Computing Systems Final Scientific & Technical Report. Report No. PPT-STR-4 to University of Southern California, Jan. 2000. 46 pages.
Athas, W.C. et al. The Design and Implementation of a Low-Power, Clock-Powered Microprocessor. Draft of paper delivered to the Proc. of the Fourth Great Lakes Symposium of VLSI Design, IEEE Press, pp. 159-164, Mar. 1994.
Athas, W.C. et al. an Energy-Efficient CMOS Line Driver Using Adiabatic Switching, ACMOS-TR-2. Jul. 1993.
Athas, W.C. et al. Energy-Recovery CMOS for Highly Pipelined DSP Designs. Proc of the International Symposium on Low-Power Electronics and Design, Monterey, CA Aug. 12-14, 1996. IEEE, 4 pages.
Athas, W. et al. AC-1: A Clock-Powered Microprocessor. Proc. of the International Symposium on Low-Power Electronics and Design, Monterey, CA, Aug. 18-20, 1997. 6 pages.
Athas, W. Low-Power VLSI Techniques for Applications in Embedded Computing. IEEE Alessandro Volta Memorial Workshop on Low-Power Design, IEEE Computer Society Press, Mar. 1999, pp. 14-22. Abstract only.
Athas, W.C. et al. Energy Recovery for Low-Power CMOS, in the Proc. Of the 1995 Chapel Hill Conference on Advanced Research in VLSI, IEEE Press, Chapel Hill, NC, Mar. 27-29, 1995. Abstract only.
Athas, W.C. et al. Low-Power Digital Systems Based on Adiabatic-Switching Principles, in the IEEE Transactions on VLSI Systems, pp. 398-407, Dec. 1994. Abstract only.
Athas, W.C. et al. Reversible Logic Issues in Adiabatic CMOS, in the Proc. Of the IEEE 1994 Workshop on Physics and Computing. 1994.
Athas, W.C. et al. A Framework for Practical Low-Power Digital CMOS Systems using Adiabatic Switching Principles, in the Proc. Of the Int'l Workshop on Low-Power Design, pp. 189-194, Apr. 1994.
Athas, W.C. Energy-Recovery CMOS. In Rabaey, Pedram (Ed.), Low Power Design Methodologies, Kluwer, 1996.
Dharmasena, S. et al. Startup Energies in Energy-Recovery CMOS, in Proc. Of Phys.Comp '986, Boston, MA, Nov. 22-24, 1996. Abstract only.
Denker J.S. A Review of Adiabatic Computing, 1994 IEEE Symposium on Low Power Electronics, Oct. 1994.
Dickinson, A.G. et al. Adiabatic Dynamic Logic. IEEE Journal of Solid-State Circuits, Mar. 1995, pp. 311-315.
Koller, J.G. et al. Thermal Logic Circuits, in the Proc. Of the IEEE 1994 Workshop on Physics and Computing. Abstract only.
Koller, J.G. et al. Adiabatic Switching, Low Energy Computing, and the Physics of Storing and Erasing Information, in the Proc. Of the Workshop on Physics and Computation, PhysCmp 92, Oct. 1992; IEEE Press, 1993. Abstract only.
Rofougaran, A. et al. SP 24.6: A 900 MHz CMOS LC-Oscillator with Quadrature Outputs. 1996 IEEE International Solid-State Circuits Conference, pp. 392-393.
Sokal, N.O. Class E High-Efficiency Switching-Mode Tuned Power Amplifier with Only One Inductor and One Capacitor in Load network—Approximate Analysis. In IEEE Journal of Solid-State Circuits, vol. SC-16, No. 4, Aug. 1981, pp. 380-384.
Sokal, N.O. et al. Class E—A New Class of High-Efficiency Tuned Single-Ended Switching Power Amplifiers. In IEEE Journal of Solid-State Circuits, vol. SC-10, No. 3, Jun. 1975, pp. 168-175.
Svensson L. et al. A Sub-CV2 Pad Driver With 10ns Transition Times, Proceedings of the International Symposium on Low-Power Electronics and Design, Monterey, California Aug. 1994, 1996. 4 pages.
Svensson L.. Adiabatic Charging Without Inductors, Proceedings of the International Workshop on Low-Power Design, San Diego, California, Apr. 1994, pp. 159-164.
Tee, L. et al. Charge Recovery and Adiabatic Switching in Digital Logic, EE 241 Midterm Report, Mar. 1997. 6 pages.
Tee, L. et al. Charge Recycling Clocking for Adiabatic Style Logic, EE241 Final Report May 1997.
Tzartzanis, N. et al. Clock-Powered Logic for a 50 MHz Low-Power RISC Datapath. In the Proc. Of the 1997 International Solid-State Circuits Conference, San Francisco, CA Feb. 6-8, 1997, 4 pages.
Tzartzanis, N. et al. Clock-Powered CMOS: A Hybrid Adiabatic Logic Style for Energy-Efficient Computing, 20th Anniversary Conference on Advanced Research in VLSI, IEEE Computer Society Press, Mar. 1999, pp. 137-151.
Tzartzanis, N. et al. Energy Recovery for the Design of High-Speed, Low-Power Static RAMS, in the Proc. Of the International Symposium on Low-Power Electronics and Design, pp. 55-60, Monterey, California, Aug. 12-14, 1996.
Tzartzanis, N. et al. Retractile Clock-Powered Logic, Proc. of the 1999 International Symposium on Low-Power Electronics and Design, pp. 18-23, San Diego, CA, Aug. 16-17, 1999. Abstract & slides presented only.
Tzartzanis, N. et al. Design and Analysis of a Low-Power Energy-Recovery Adder, in the Proc. Of the fifth Great Lakes Symposium on VLSI Design, IEEE Press, pp. 66-69, Buffalo, NY, Mar. 16-18, 1995.
Tzartzanis, N. Energy-Recovery Techniques for CMOS Microprocessor Design, EE-Systems Department, University of Southern California, Aug. 1998.
Athas W.C. et al. A Low-Power Microprocessor Based on Resonant Energy, IEEE Journal of Solid-State Circuits, Nov. 1997, pp. 1693-1701. (Abstract only).
Athas W.C. et al. A Resonant Signal Driver for Two-Phase, Almost-Non-Overlapping Clocks, Proceedings of the 1996 International Symposium on Circuits and Systems, Atlanta, GA, May 12-15, 1996. Abstracts & article, pp. 129-132.

\* cited by examiner

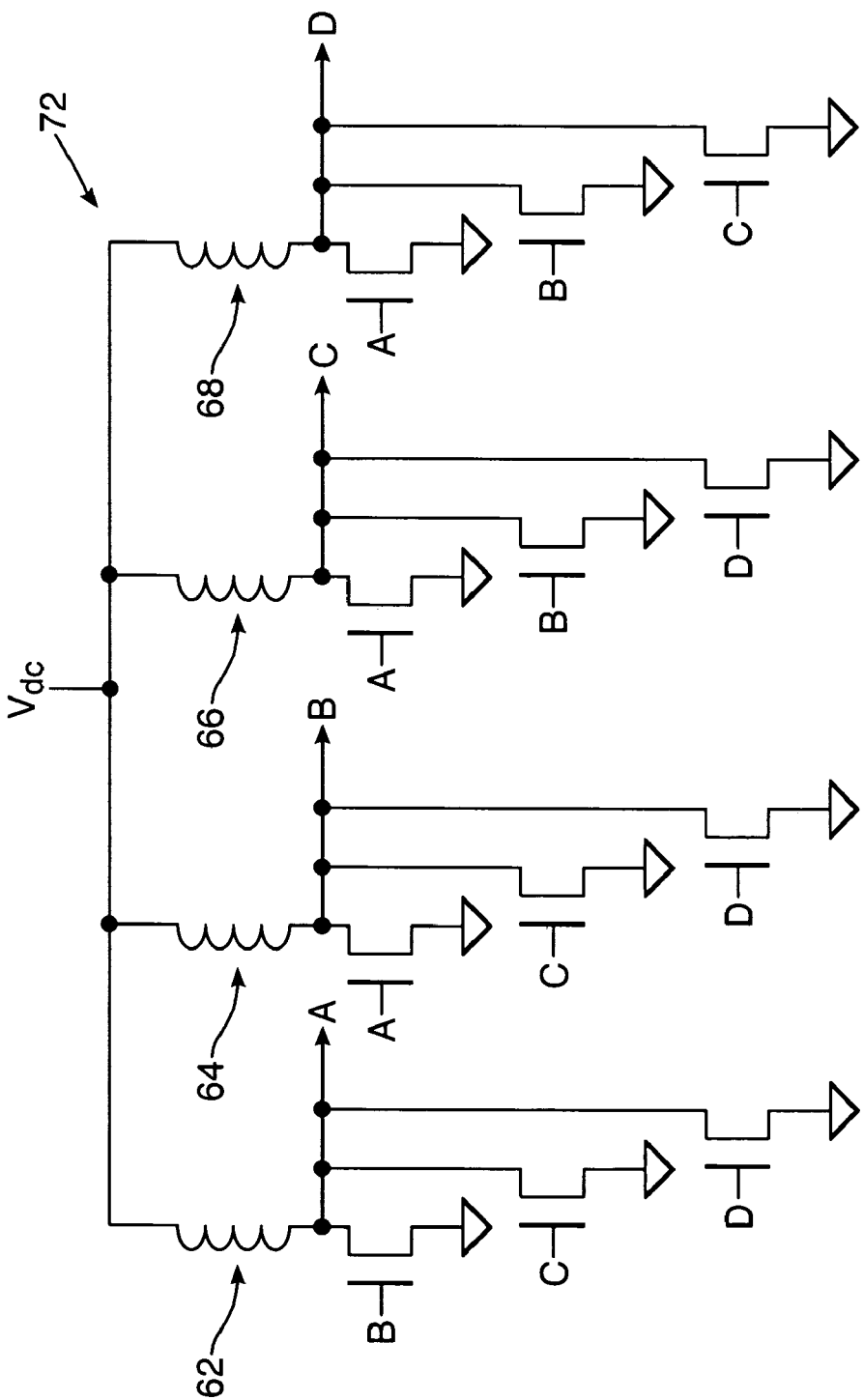

MULTIPHASE RESONANT PULSE GENERATORS

CROSS REFERENCE TO RELATED APPLICATIONS

This application claims the benefit of PCT Application No. PCT/US01/24801, filed Aug. 8, 2001, which claims the benefit of Provisional Application 60/224,253, filed Aug. 10, 2000.

The invention was made with government support under Defense Advanced Research Project Agency (DARPA), Control DAAL01-95-K-3528. The government has certain rights in the invention.

BACKGROUND OF THE INVENTION

1. Field of the Invention

The present invention relates to pulse generators and more particularly to multiphase resonant pulse generators.

2. General Background and State of the Art

Many applications in electronics require a driving signal consisting of a series of pulses. Such applications exist in the fields of digital, analog, electromechanical and power electronics, among others.

Many of these applications present a load having significant capacitive reactance. In turn, this is a source of significant power dissipation.

Many applications require low power dissipation. One example is portable computers. As is well known, portable computers run on batteries. The length of time the portable computer can run on a single charge is often a very important specification.

Mathematically, the power P dissipated by a system having a capacitance C and being cycled through a voltage V at a frequency F is:

$$P = D \times F \times CV^2$$

where D is the dissipation factor and reflects the energy efficiency of the circuit. For non-resonant systems, D is usually equal to 1 or higher. In resonant systems, the value of D can be reduced to substantially less than one.

One of the simplest ways to generate cyclic signals which have small dissipation factors is with a tuned circuit, such as an LC-tank. This type of circuit supplies a sinusoidal current and voltage waveform to the capacitive load.

Although LC-tank circuits are straightforward to operate with high efficiency, they are generally unsuitable for powering capacitive loads with "digital" properties. Typically, these applications require a multiplicity of pulse signals in the form of repetitive pulse trains with little or no overlap between pulses and with sizable "off" intervals during which individual pulse signals remain at near-zero levels. The most well-known of these timing methodologies for digital VLSI circuits is two-phase, non-overlapping clocking. See L. A. Glasser, D. W. Dobberpuhl, "The Design and Analysis of VLSI Circuits," Addison-Wesley, Reading, 1985. Other examples include:

1. the row and column select lines of an LCD matrix;
2. micro-electromechanical devices;
3. on-chip gate and parasitic capacitance of a MOS VLSI chip;
4. off-chip capacitive loads (e.g., I/O pads) of a MOS VLSI chip;
5. bootstrapped circuits; see R. E. Joynson, J. L. Mundy, J. F. Burgess, C. Neugebauer, . . . "Eliminating Threshold Losses in MOS Circuits by Boot-Strapping Using Varactor Coupling," IEEE Jnl of Solid-State Circuits, SC-7, No. 3, June 1972; C. L. Seitz, A. H. Frey, S. Mattisson, S. D. Rabin, D. A. Speck, J. L. A. van de Snepscheut, "Hot-Clock nMOS," Proc. of the 1985 Chapel-Hill Conf on VLSI, . April 1985; L. A. Glasser, D. W. Dobberpuhl, "The Design and Analysis of VLSI Circuits," Addison-Wesley, Reading, 1995; N. Tzartzanis, W. C. Athas, "Design and Analysis of a Low Power Energy-Recovery Adder," Fifth Great Lakes Symposium on VLSI, March 1995; and W. C. Athas, "Energy-Recovery CMOS," (Massoud Pedram, editor) Kluwer Academic Publishers, 1995;
6. energy-recovery CMOS circuits; see N. Tzartzanis, W. C. Athas, "Design and Analysis of a Low Power Energy-Recovery Adder," Fifth Great Lakes Symposium on VLSI, March 1995; W. C. Athas, "Energy-Recovery CMOS," (Massoud Pedram, editor) Kluwer Academic Publishers, 1995 and S. G. Younis, "Asymptotically Zero Energy Computing Using Split-Level Charge Recovery Logic," Ph.D. thesis, Massachusetts Institute of Technology, June 1994; and
7. adiabatic CMOS circuits; see W. C. Athas, L. Svensson, J. G. Koller, N. Tzartzanis, E. Y.-C. Chou, "Low-Power Digital Systems Based on Adiabatic-Switching Principles," IEEE Trans. on VLSI System, Vol 2, No. 4, December 1994 and J. S. Denker, "A Review of Adiabatic Computing," 1994 IEEE Symposium on Low Power Electronics, October 1994.

An LC-tank circuit with a split capacitive load provides two-phase symmetrical sinusoidal signals 180 degrees out of phase. However, the signals are often not useful for clocking purposes because of the significant overlap between the phases and the almost-zero off interval.

Thus, there continues to be a very substantial need for pulse generation systems which can drive loads having significant capacitive reactance with a minimum of power dissipation.

INVENTION SUMMARY

A multiphase resonant pulse generator has N groups of N-1 switches which, when activated, form N paths from a power supply to ground or a reference voltage. Here N is a positive integer greater than 2. Each of the paths includes an inductance and N-1 switches. Signal outputs from each of the N paths are attached to loads. The signal outputs from each of the N paths are cross coupled to switches belonging to the other N-1 paths to activate and deactivate the groups of switches. The cross coupled signal outputs control the switches by producing alternating intervals of substantially sinusoidal shaped resonant pulses and intervals of substantially constant output voltage. The lengths of the intervals are unequal, with one interval N-1 times longer than the other interval. The intervals of substantially constant output voltage are produced when a group of switches is controlled by the outputs from the other N-1 paths to clamp the group of switches to the reference voltage or ground. Each one of the resulting N substantially sinusoidal shaped resonant pulses of the signal outputs are 360/N degrees out of phase with the resonant pulse of another one of the N signal outputs.

A multiphase resonant pulse generator of the present invention includes a voltage source; a load electrically connected to the voltage source; a switch electrically connected to the voltage source and the load; and a circuit inductance and a circuit capacitance of the pulse generating circuit which cause the circuit to resonate and produce a stream of substantially sinusoidal shaped resonant pulses delivered to the load. The switch is alternately activated and deactivated by a control signal so that the stream of substantially sinusoidal shaped resonant pulses delivered to the load has alternate pulse intervals and off intervals of unequal length.

The present invention also includes the method for generating multiphase pulses comprising alternately activating and deactivating a switch electrically connected to a voltage source and a load so that a stream of substantially sinusoidal shaped resonant pulses having alternate pulse and off intervals of unequal length is delivered to the load.

The multiphase pulse generator of the present invention additionally includes signal outputs where N is an integer greater than 2; N groups of switches electrically connected to each of the N signal outputs, each of the N groups of switches having N-1 control contacts for receiving control signals from the signal outputs for activating and deactivating the N groups of switches so that the N signal outputs produce substantially sinusoidal shaped resonant pulses 360/N degrees out of phase with each other.

The method for generating pulses of the present invention further comprises: supplying control voltages to activate and deactivate N electrically parallel groups of N-1 switches, the N groups controlling N signal outputs of substantially sinusoidal shaped resonant pulses 360/N degrees out of phase with each other; and coupling each one of the N signal outputs from one of the groups to a switch of another one of the groups to supply the control voltages, wherein N is an integer greater than 2.

BRIEF DESCRIPTION OF THE DRAWINGS

FIG. 8 is diagrammatic view of a four-phase resonant pulse generator comprised of four pull-down paths each having three switches in parallel;

DETAILED DESCRIPTION OF THE PREFERRED EMBODIMENTS

While the specification describes particular embodiments of the present invention, those of ordinary skill can devise variations of the present invention without departing from the inventive concept.

The present invention includes resonant circuits and a method for constructing resonant circuits for generating streams of pulses which are substantially sinusoidal in shape and which can be configured to exhibit significant periodic intervals during which each pulse stream is held at a steady clamping level voltage close to a preset voltage (typically the positive or negative supply voltage level or ground). Here, substantially sinusoidal means that the pulses are similar in shape to the 0–180 degree or 180–360 degree portions of a sine wave. The amount of similarity in shape between the actual pulses and a sine wave can vary depending on the particular application in which the resonant pulse generator is used. The circuit topologies can be made to be all-resonant to obtain high efficiency.

U.S. Pat. No. 5,559,478 to Athas et al. is incorporated by reference in its entirety into the present disclosure and teaches how to implement one member of this circuit family. The patent shows how to create streams of pulses which have the desirable property that the waveforms are zero or close to zero for one-half of the cycle and have a substantially sinusoidal pulse during the other half of the cycle.

These circuits can be hooked up in a back-to-back configuration to generate two pulse streams that are out of phase by 180 degrees and are almost non-overlapping. The circuits are quite useful for a number of digital applications involving two-phase clocking (see W. Athas, N. Tzartzanis, L. Svensson, and L. Peterson, A low-power microprocessor based on resonant energy, in the IEEE Journal of Solid-State Circuits, November 1997, pp. 1693–1701). The small amount of overlap turns out to be unimportant from a practical standpoint because of the threshold voltage and body effect in CMOS transistors.

The present invention allows the generation of an arbitrary number of non-overlapping or almost non-overlapping pulses. It can also generate overlapping pulses and pulses having opposite polarities, i.e. pulses that swing from the positive rail down towards the negative rail or ground.

Figure 1:
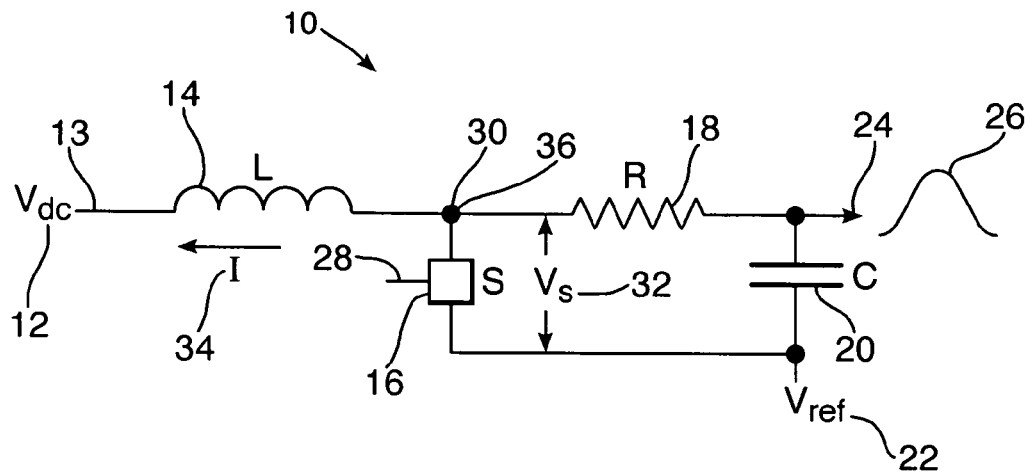
FIG. 1 is a diagrammatic view of a single phase circuit embodiment of the present invention.
Figure 3:
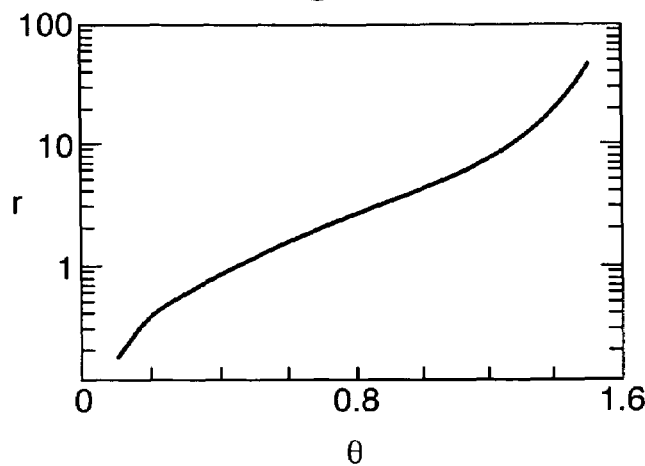
FIG. 3 plots r as a function of theta.

FIG. 1 illustrates a single phase circuit 10 embodiment of the present invention. A input DC voltage $V_{dc}$ 12 is input to the circuit 10 at an input 13 and the circuit outputs a signal 26 from an output 24. The circuit has an inductance L 14, a resistance R 18 and a capacitance C 20. The inductance L 14 can be connected in parallel between the input 13 and the output 24 rather than in series as illustrated in FIG. 1. The capacitance 20 represents the load capacitance and can additionally represent the source capacitance and any other combined capacitances of the circuit 10. A MOSFET switch 16 is connected so as to clamp a point 30 between the input 13 and the output 24 to a reference voltage $V_{ref}$ 22 when the switch 16 is activated by a control signal 28. The switch 16 is activated when the control signal 28 exceeds a clamping level for the switch 16. The reference voltage 22 can be ground, as illustrated in FIG. 3 of the above referenced U.S. Pat. No. 5,559,478, or it can be some positive or negative value. Some operating conditions of the invention can be summarized as:

1. The switch 16 is only turned on or off when a voltage $V_s$ 32 across the switch is approximately zero.

2. The switch 16 is turned on only when current flow I 34 through the inductance 14 is of the opposite polarity to the current direction formed by the path formed by $V_{dc}$, L, and $V_{ref}$. The inductance 14 forces the current amplitude to reverse polarity over a finite time period, while the voltage drop across the output capacitive load 20 remains zero or close to zero since a voltage 36 at the point 30 becomes approximately equal to the reference voltage 22.

3. When the switch 16 is turned off, the current and voltage follow sinusoidal trajectories that are typical of inductor-capacitor (LC) "tank" circuits, i.e., current and voltage are 90 degrees out of phase.

4. Resistive losses 18 in the LC tank circuit have a negligible effect upon the sinusoidal shape of the current and voltage waveforms when the switch 16 is turned on.

When S is off (condition #3), the output waveforms are substantially sinusoidal in shape. These waveforms are commonly referred to as "blips." During the blip, current and voltage are modeled by the equations:

$$I(t) = I_0 \cos \omega t \quad \text{(EQ 1)}$$

$$V(t) = V_0 \sin \omega t \quad \text{(EQ 2)}$$

where I(t) is the current through the inductance 14, V(t) is the voltage $V_s$ across the switch 32, $\omega$ is the angular frequency and t is time. When S is on (condition #2), the circuit is said to be in its linear switchback region. The current for this region is modeled as:

$$I(t) = I_l t + I_b \quad \text{(EQ 3)}$$

The present invention satisfies the zero-voltage-switching condition of condition #1 with the endpoint conditions of condition #2. In the above referenced U.S. patent and in the ISCAS paper (see W. Athas, L. Svensson, N. Tzartzanis, "A Resonant Clock Driver for Two-Phase, Almost-Non-Overlapping Clocks," Proc. of the 1996 International Symposium on Circuits and Systems, Atlanta, Ga., May 12–15, 1996) this is done by algebraically manipulating the equations when the two phases defined by condition #2 and condition #3 are of equal duration.

Figure 2:
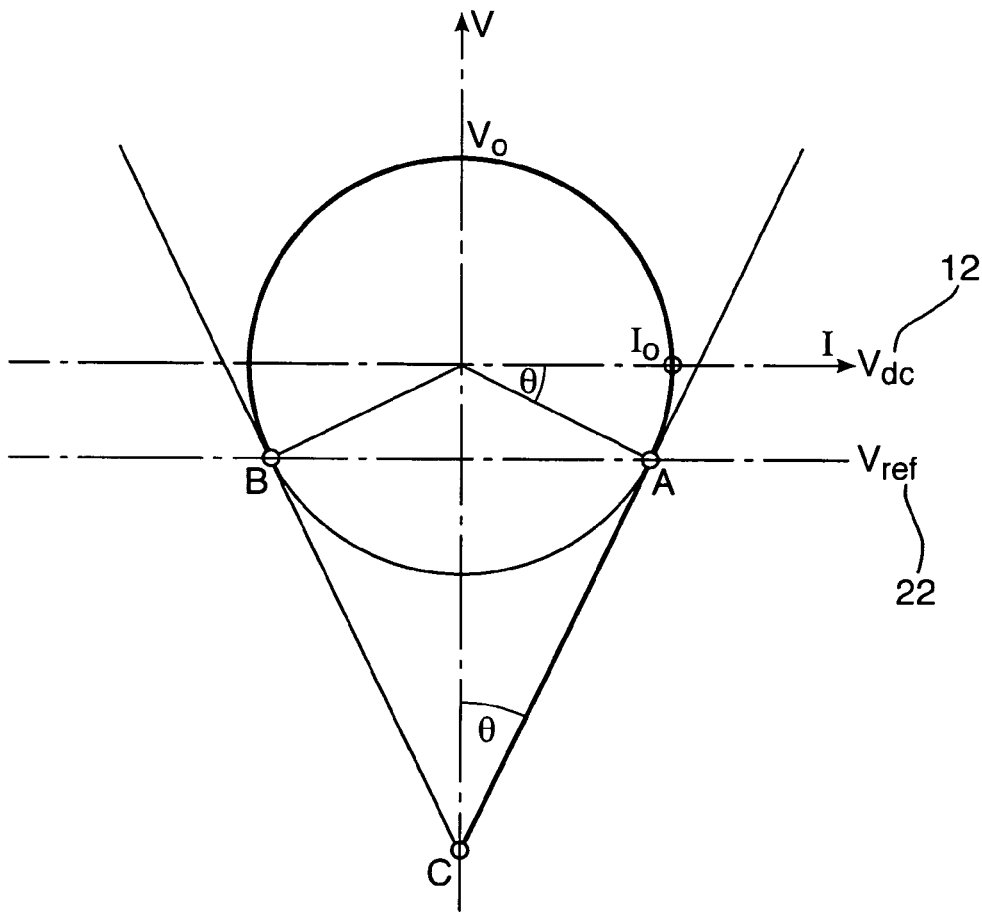
FIG. 2 schematically illustrates the relationship between the resonant blip and the linear switchback.

FIG. 2 is a geometrical construction illustrating the relationships between equations 1–3 by mapping them onto a unit circle. The relationship between the resonant blip and the linear switchback is shown. The horizontal dimension is current and the vertical dimension above the line that passes through points A and B is voltage. Below points A and B the voltage is $V_{ref}$ 22.

Current and voltage are normalized to $I_0$ and $V_0$ respectively. The length of the arc from A to B is equal to the length of the resonant blip as defined by Eqs. 1 and 2 and by condition #2. The length of the line segments AC plus BC equals the switchback interval of Eq. 3.

The length of the arc AB should be greater than $\pi$ radians which corresponds to the upper half of the unit circle. At exactly $\pi$ radians, there is zero voltage potential across the inductance 14 so that when S is turned on, no current will flow. Condition #2 cannot be met if the potential drop across the inductance 14 is zero.

By increasing the potential drop across the inductance 14, the portion of the circle prescribed by the arc AB increases beyond $\pi$ radians. Geometrically this raises the upper half of the circle to the voltage $V_{dc}$ (normalized to $V_0$) which is greater than $V_{ref}$ 22.

The angle of interest is theta ($\theta$) which symmetrically extends an equal amount on either side of the top half of the unit circle to the points A and B.

During switchback the line segments AC and BC define the current which linearly draws down to $V_{ref}$ (point C) and then increases back to point A. The output voltage in this region is $V_{ref}$ 22.

The ratio of thee line segments AC plus BC to the arc AB is defined by the parameter r.

$$r = \frac{arclength AB}{segment BC + segment AC} \quad \text{(EQ 4)}$$

By definition, one half the arc distance from A to B equals the segment length from A to C times r. The radius equals one (unit circle). The tangent of angle $\theta$ equals the reciprocal of the segment length AC (or BC).

$$\tan\theta = \frac{r}{\left(\frac{\pi}{2} + \theta\right)} \quad \text{(EQ 5)}$$

Finding the fixed-point of this equation can be done with numerical methods such as Newton-Raphson iterations. The value of r can also be expressed in closed form as a function of theta:

$$r(\theta) = \left(\frac{\pi}{2} + \theta\right)\tan\theta \quad \text{(EQ 6)}$$

The relationship between $\theta$ and r is graphed in FIG. 3. TABLE 1 lists some key values for $\theta$ and r. Note that in U.S. Pat. No. 5,559,478, referenced above, r is unity and theta equals 0.458. The present invention provides a design method and the resulting circuits of other circuits in this circuit family.

TABLE 1

| r | theta |
|---|---|
| ¼ | 0.144710826 |
| ⅓ | 0.187367843 |
| ½ | 0.265800876 |
| 1 | 0.457961511 |
| 2 | 0.7181334 |
| 3 | 0.884847536 |
| 4 | 0.999635234 |

When r is unity, then the pulse interval and the off interval are of equal duration. For the case r>1, the pulse interval is longer than the off interval. For r<1, the pulse interval is less than the off interval. This design procedure is used to chose a duty cycle of arbitrary duration.

Figure 6:
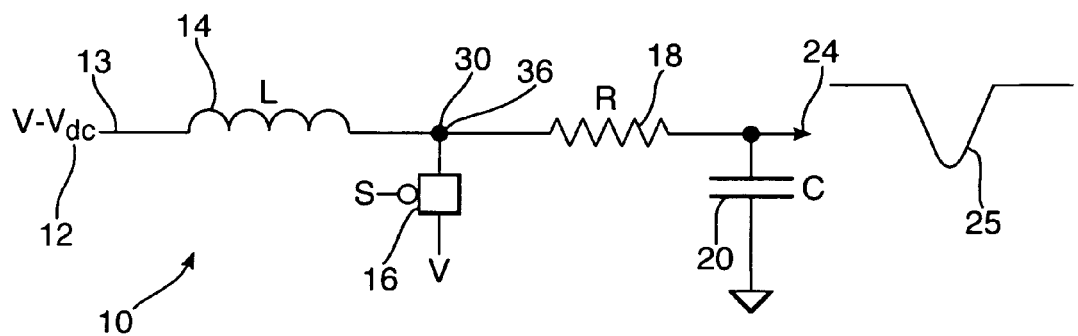
FIG. 6 is a diagrammatic view of a reversed-polarity single phase resonant pulse generator embodiment of the present invention.

FIG. 6 shows how to reverse the polarity of these circuits by using a complementary switch, i.e., a p-channel MOSFET instead of an n-channel MOSFET, and by replacing $V_{ref}$ 22 in FIG. 1 with a positive supply voltage V and imputing (V-$V_{dc}$) to the input 12. The pulses work as before except that there is a negative-going pulse 25 relative to the positive supply voltage V. In general, p-channel MOSFETs are used to pull current up from a reference voltage of approximately 5 volts while n-channel MOSFETs are used to pull current down to ground or to $V_{ref}$ 22.

The present invention includes all-resonant multi-phase generators built using networks of switches (e.g., MOSFETs) that include series and parallel connections. An advantage of these all-resonant generators is greater power savings. The CMOS switches 16 illustrated in FIGS. 1 and 6 produce $I^2R$ power losses when pulling the current to or from the reference voltage. One way to reduce these power losses is to make the switches as large as possible to lower the resistance. However, larger switches take more power to switch on and off than smaller switches. By using the cross-coupling of the resonant network, and the switch capacitance combined with the capacitance 20, to activate the switches rather than separate power supplies, power is conserved when activating the switches.

One type of network topology combines the single phase circuits 10 of FIGS. 1 or 6 having r<1, wherein 1/r can have an arbitrary positive integer value. Another type of network topology combines the single phase circuits 10 of FIGS. 1 or 6 having r>1, wherein r can have an arbitrary positive integer value.

Figure 4A:
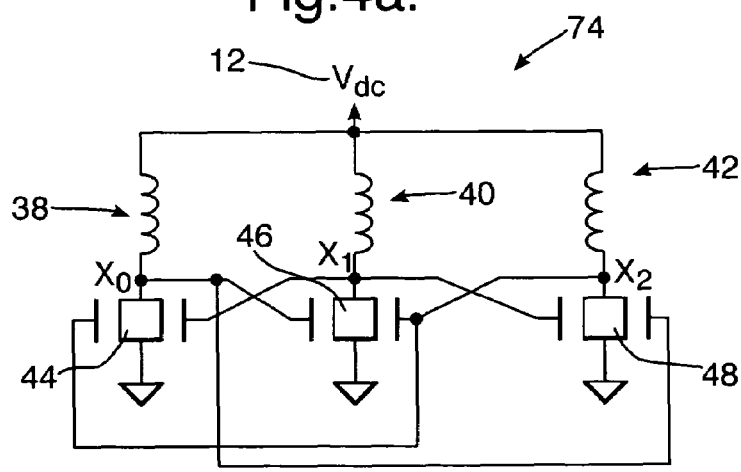
FIG. 4(a) is diagrammatic view of a three-phase resonant pulse generator comprised of three pairs of back-to-back switches.
Figure 4B:
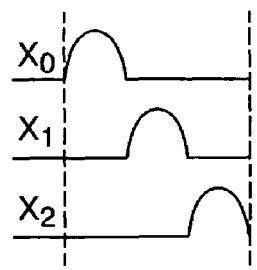
FIG. 4(b) plots the pulse train coming from the outputs of the network of FIG. 4(a)

FIG. 4(a) illustrates circuit 74 comprised of three circuits 38, 40, 42 having r=½ so that for each single phase circuit the duration of the off interval is twice that of the resonant pulse interval. A full cycle is defined as composed of three phases of equal duration. In one phase there is a pulse, and in the other two phases there are no pulses. The three such circuits 38, 40, 42 when combined as shown in FIG. 4(a), resonate 120 degrees out of phase with no appreciable overlap. Pairs of switches 44, 46, 48 are connected in parallel (e.g. back to back n-channel MOSFETS). The pull down path (the path through the switches to ground or $V_{ref}$) for each of the outputs ($X_0$, $X_1$, $X_2$) includes two switches which are controlled by the two other outputs. The result is a pulse stream of three almost non-overlapping, substantially sinusoidal pulses that are out of phase by 120 degrees as shown in FIG. 4(b).

The circuits 38, 40, 42 function as NOR circuits. The Boolean equations for the outputs $X_0$, $X_1$, $X_2$ of the circuit 74 are:

$$X_0 = X_1\char`\^ X_2$$

$$X_1 = X_2\char`\^ X_3$$

$$X_2 = X_1\char`\^ X_3$$

Only one of the circuits outputs a pulse at a given time since an output from one of the circuits will clamp the outputs of the other circuits to the reference voltage or to ground. Thus, for example, a signal is output from "$X_0$" when the inputs "$X_1$" and "$X_2$" to the switches 44 are below the threshold values of the switches. The signal "$X_0$" is then input into the other switches 46, 48, clamping their respective outputs to zero. When the conditions #1 and #2 described above are satisfied by the circuit 38, the switch 44 is activated, clamping the output "$X_0$" of the circuit 38 to ground and the other circuits 40, 42 then sequentially produce output pulses as did the circuit 38 until a full cycle is completed.

FIG. 8 illustrates an embodiment of the invention utilizing circuits having r=⅓ so that for each single phase circuit the duration of the off interval is three times that of the resonant pulse interval. A full cycle is defined as including four phases of equal duration. For each circuit, in one phase there is a pulse, and in the other three phases there are no pulses. Four such circuits 62, 64, 66, 68 when combined to form the circuit 72 as shown in FIG. 8 will resonate 90 degrees out of phase with no appreciable overlap. Triplets of switches 44, 46, 48 (e.g. MOSFETS) are connected in parallel. The pull down path (the path through the switches to ground or $V_{ref}$) for each of the outputs (A, B, C, D) includes three switches which are controlled by the three other outputs. The result is a pulse stream of four almost non-overlapping, substantially sinusoidal pulses that are out of phase by 90 degrees as illustrated in FIG. 7(b).

The circuits 62, 64, 66, 68 function as NOR circuits. The Boolean equations for the outputs A through D of the circuit 72 are:

$$A = B\char`\^ C\char`\^ D$$

$$B = A\char`\^ C\char`\^ D$$

$$C = A\char`\^ B\char`\^ D$$

$$D = A\char`\^ B\char`\^ C$$

Only one of the circuits outputs a pulse at a given time since an output from one of the circuits will clamp the other circuits to the reference voltage or to ground. Thus, for example, a signal is output from "A" when the inputs "B", "C", "D" to the circuit 62 are below the threshold values of the switches. The signal "A" is then input into the other circuits 64, 66, 68, clamping their respective outputs to zero. Once the output "A" of the circuit 62 is clamped to ground the other circuits will sequentially produce output pulses until a full cycle is completed.

Figure 7A:
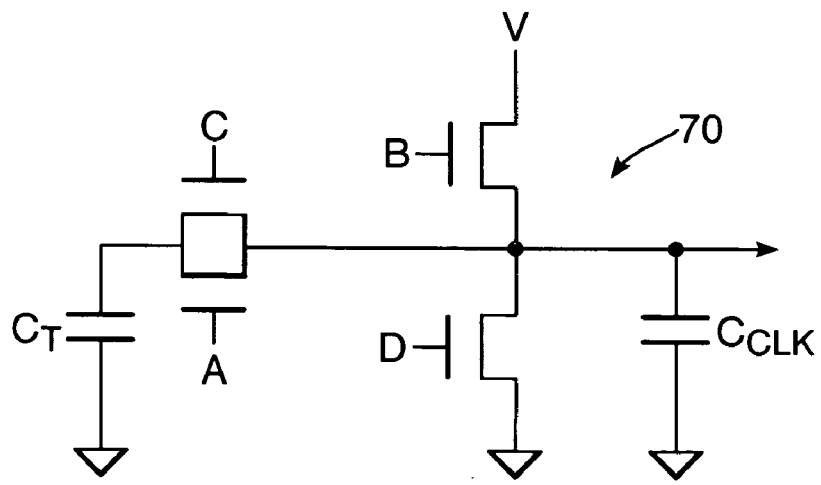
FIG. 7(a) illustrates a 2-step driver circuit suitable for use as a clock driver.
Figure 7B:
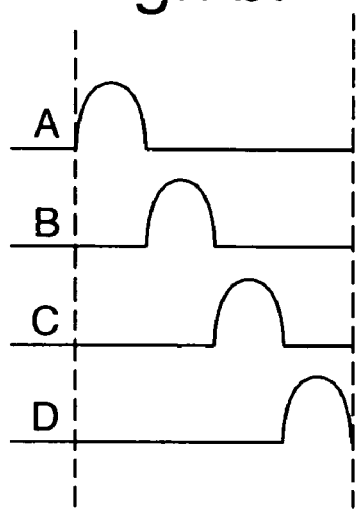
FIG. 7(b) plots the blip waveforms coming from the outputs of the network of FIG. 8 and used to sequence the four n-channel MOSFETs of the 2-step driver of FIG. 7(a)

The circuit 72 of FIG. 8 can be used to drive a four n-channel MOSFET, two-step driver 70 depicted in FIG. 7(a) by supplying the timing signals A, B, C, D illustrated in FIG. 7(b) to the four corresponding inputs marked A, B, C, D of the driver 70. The circuit 72 is suitable for use as a clock driver that cycles the clock signal between ground and a positive voltage V. The circuit recovers and reuses the capacitive energy of the clock line through the tank capacitor $C_T$. Usually the energy required to pulse the transistor gates A through D is fully dissipated in stepwise drivers. In this application the pulses are resonantly generated, thus significantly improving the overall efficiency of the stepwise driver 70. The theory of stepwise charging and the practicalities of circuits such as that of FIG. 7(a) are described in L. Svensson, "Adiabatic charging without inductors," Proc. of the International Workshop on Low-Power Design, San Diego, Calif., pp. 159–164, April 1994 and L. Svensson, W. Athas, R.S-C. Wen, "A sub-CV2 pad driver with 10 ns transition times," Proc. of the International Symposium on Low-Power Electronics and Design, Monterey, Calif., August 1994.

In the above description it is stated that for the case of r<1, only one of the circuits outputs a pulse at a given time. It also describes that the pulses of each output are almost non-overlapping. However, depending on the application, some amount of overlap in time between pulses is acceptable. Thus "non-overlapping" can vary in the amount of overlap depending on the given application. In some applications the outputs should not overlap while in others there can be some overlap. A small amount of overlap usually turns out to be unimportant from a practical standpoint because of the threshold voltage and body effect in CMOS transistors, for example.

Figure 5A:
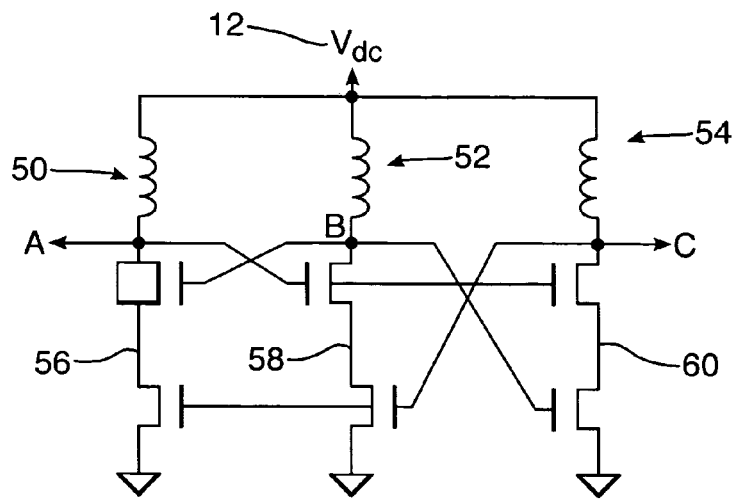
FIG. 5(a) is diagrammatic view of a three-phase resonant pulse generator comprised of three pull-down paths of two series switches.
Figure 5B:
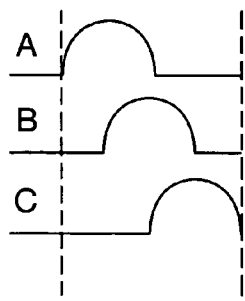
FIG. 5(b) plots the overlapping resonant pulse train coming from the outputs of the network of FIG. 5(a)

A dual situation exists when r>1. Consider the case of r=2. The pulse interval is twice as long as the off interval. Three circuits 50, 52, 54 can then be combined as shown in FIG. 5(a). Pairs of switches 56, 58, 60 are connected in series. The pulldown path for each of the outputs A, B, C travels through the respective pairs of switches 56, 58, 60 which are driven by two other outputs. For example, the pulldown path from the output A passes through the series pair of switches 56. The switches 56 are driven by the outputs B and C. The result is a pulse stream of three substantially sinusoidal pulses that overlap by 120 degrees as illustrated in FIG. 5(b).

The circuits 50, 52, 54 function as NAND circuits. The output "A", for example, is activated if either of the inputs "B" or "C" to the switches 56 is not activated. The Boolean equations for the outputs A through D of the circuit 72 are:

$$A=B+C$$

$$B=A+C$$

$$C=A+B$$

This topology can be readily generalized for an arbitrary positive integer value of r. For example, for r=3, each of four pulldown paths includes three switches in series. The three switch inputs come from the three other outputs.

Figure 9A:
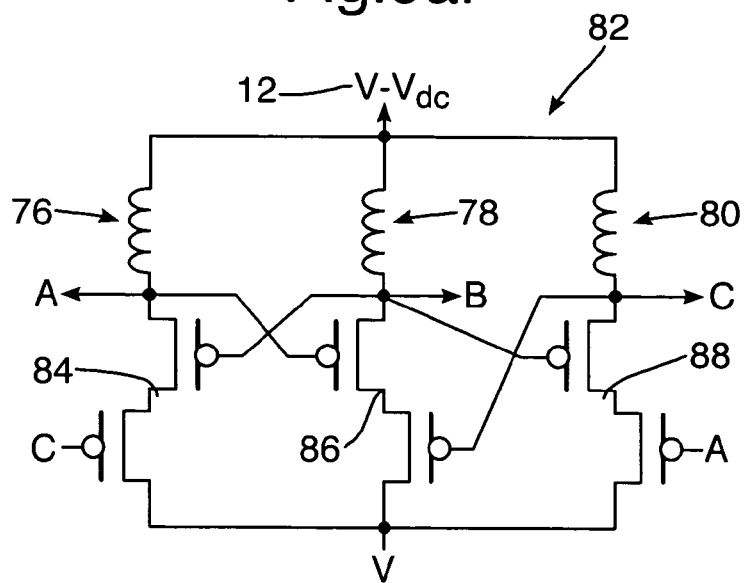
FIG. 9(a) is diagrammatic view of a three-phase resonant negative-going pulse generator comprised of three pull-down paths of two series switches.
Figure 9B:
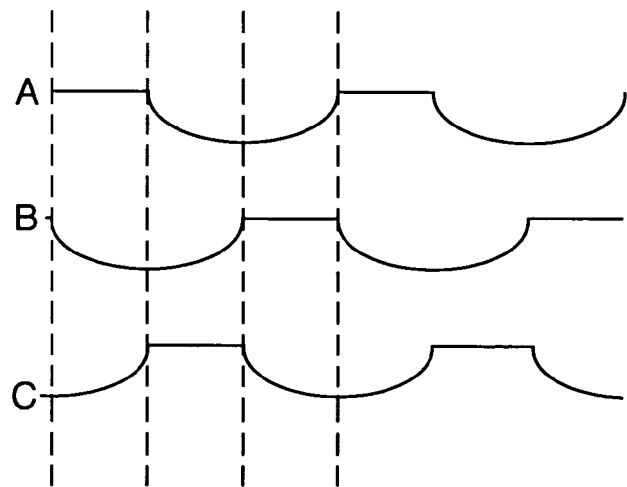
FIG. 9(b) plots the overlapping resonant pulse train coming from the outputs of the network of FIG. 9(a).

The circuit of FIG. 9(a) combines the p-channel MOS-FETS described in FIG. 6 above to form a circuit 82 for negative going pulses. The circuits 76, 78, 80 again function as NAND circuits. Pairs of switches 84, 86, 88 are connected in series. The output waveforms A, B, C are shown in FIG. 9(b). This circuit is useful as a clock driver for charge-coupled devices (CCDs) and reversible shift registers based on bootstrapped gates. The clock signals are 120 degrees out of phase. Note for each clock signal, when one is high, a second one is going low, and the third is going high.

Although the flat sections of the signal generated by the present invention have thus-far been illustrated as having a substantially zero voltage, it is to be understood that the actual voltage level could be positive or negative, depending upon offsets which are intrinsic to the circuit which is actually used.

Similarly, it is by no means essential that a MOSFET be used as the clamping device. Other types of semiconductor devices might be used instead, as well as other types of electronic switching devices and control devices.

Thus far, moreover, the illustrations of the various embodiments of the invention have utilized extremely basic circuitry with very few components. It is contemplated that circuitry implementing the present invention might well have many additional components and might well have vastly different configurations.

The specific embodiments of the invention have been described in detail herein with reference to the accompanying drawings. But it is to be understood that the invention is not limited to these embodiments. Various changes and modifications may be effected by one skilled in the art without departure from the scope or spirit of the invention as defined in the appended claims. In short, the invention is limited solely by the following claims.

I claim:

1. A pulse generating circuit for generating N streams of pulses, where N is an integer greater than 2, each pulse having a substantially sinusoidal shape, each of the N streams out of phase by 360/N degrees from another stream for driving N loads having input capacitances, comprising:
    a power source having an output capacitance;
    N inductors connected to said power source and the N loads which resonate with the output capacitance and the input capacitances to generate the N streams of sinusoidal pulses;
    N groups of clamping devices connected to the N inductors for preventing the N streams of pulses which are driving the N loads from exceeding clamping levels, each of the N groups of clamping devices being cross coupled to and driven by N-1 of the N streams of pulses.

2. The circuit of claim 1 wherein:
    said N groups of clamping devices include electronic switches having control inputs connected to the N stream of pulses.

3. The circuit of claim 2 wherein the electronic switches are MOSFETs.

4. The circuit of claim 1 wherein the inductances of the inductors are substantially the same.

5. The circuit of claim 1 wherein each control signal operates at a frequency which is less than the frequency at which, each of said inductors resonate with the output capacitance and the input capacitance to which it is connected.

6. The circuit of claim 1 wherein each of said N groups of clamping devices prevents the stream of pulses which it clamps from reversing in polarity.

7. The circuit of claim 1 wherein said power source is a DC power source.

8. A pulse generating circuit comprising:
    N signal outputs where N is an integer greater than 2;
    N groups of switches electrically connected to each of the N signal outputs, each of the N groups of switches having N-1 control contacts for receiving control signals from the signal outputs for activating and deactivating the N groups of switches so that the N signal outputs produce N substantially sinusoidal shaped resonant pulses 360/N degrees out of phase with each other.

9. The pulse generating circuit of claim 8, wherein each of the N outputs has on intervals in which sinusoidal shaped resonant pulses are produced and off intervals in which the pulse voltage remains substantially constant.

10. The pulse generating circuit of claim 9, wherein each of the N groups is comprised of N-1 parallel connected switches each having a control contact.

11. The pulse generating circuit of claim 9, wherein one of the N outputs produces a resonant pulse when the other N-1 outputs produce off intervals.

12. The pulse generating circuit of claim 10, wherein the off intervals are approximately N-1 times longer than the on intervals.

13. The pulse generating circuit of claim 9, wherein the N groups of switches are comprised of N-1 series connected switches each having a control contact.

14. The pulse generating circuit of claim 13, wherein the one of the N outputs produces a resonant pulse when any of the other N-1 outputs produce the off interval.

15. The pulse generating circuit of claim 13, wherein the on intervals are approximately N-1 times longer than the off intervals.

16. A method for generating pulses comprising:
    supplying control voltages to activate and deactivate N electrically parallel groups of N-1 switches, the N groups controlling N signal outputs of substantially sinusoidal shaped resonant pulses 360/N degrees out of phase with each other; and
    coupling each one of the N signal outputs from one of the groups to a switch of another one of the groups to supply said control voltages, wherein N is an integer greater than 2.

17. A pulse generating circuit comprising:
    a voltage input;
    a reference input;
    N groups of switches electrically connected between the voltage and reference inputs, each one of the N groups including N-1 control contacts, wherein N is an integer greater than 2;

N outputs controlled by the N groups of switches, the N outputs including on intervals of substantially sinusoidal shaped resonant pulses and separate off intervals, wherein one interval has a length N-1 longer than the other interval and the N outputs are 360/N degrees out of phase with each other; and wherein the N outputs are input to the N-1 control contacts to alternately switch between the intervals of substantially sinusoidal shaped resonant pulses and separate off intervals.

* * * * *